(12) United States Patent
Goeldner et al.

(10) Patent No.: US 11,467,206 B2
(45) Date of Patent: Oct. 11, 2022

(54) APPARATUS AND METHOD FOR CALIBRATING A BATTERY SIMULATOR

(71) Applicant: KRISTL, SEIBT & CO. GESELLSCHAFT M.B.H., Graz (AT)

(72) Inventors: Arthur Goeldner, Faak am See (AT); Christian Auer, Graz (AT); Thomas Haidinger, Hart bei Graz (AT); Stefan Pircher, Graz (AT)

(73) Assignee: KRISTL, SEIBT & CO. GESELLSCHAFT M.B.H., Graz (AT)

( * ) Notice: Subject to any disclaimer, the term of this patent is extended or adjusted under 35 U.S.C. 154(b) by 29 days.

(21) Appl. No.: 16/756,764

(22) PCT Filed: Oct. 24, 2018

(86) PCT No.: PCT/AT2018/060256
§ 371 (c)(1),
(2) Date: Apr. 16, 2020

(87) PCT Pub. No.: WO2019/079836
PCT Pub. Date: May 2, 2019

(65) Prior Publication Data
US 2020/0333392 A1    Oct. 22, 2020

(30) Foreign Application Priority Data

Oct. 25, 2017   (AT) .............................. A 50895/2017

(51) Int. Cl.
*G01R 31/28*   (2006.01)
*G01R 31/396*   (2019.01)
(Continued)

(52) U.S. Cl.
CPC ....... *G01R 31/2848* (2013.01); *G01R 31/367* (2019.01); *G01R 31/3842* (2019.01); *G01R 31/396* (2019.01)

(58) Field of Classification Search
CPC .............. G01R 31/2848; G01R 31/396; G01R 31/3842; G01R 31/367; G01R 31/006; G01R 31/382; G01R 31/40; G01R 35/00
See application file for complete search history.

(56) References Cited

U.S. PATENT DOCUMENTS 6,504,395 B1    1/2003   Johnson
8,138,822 B1 *  3/2012   Cyrusian ....................... 327/538
(Continued)

FOREIGN PATENT DOCUMENTS

AT        29621472     * 12/1996    ........... G01R 31/396
CN        102033176 A    4/2011
(Continued)

OTHER PUBLICATIONS

Ehtesham, B. et al., "Development of an Automated Precision Direct Current Source for Generation of pA Currents Based on Capacitance Charging Method at CSIR NPL," MAPAN, vol. 32, No. 1, Aug. 19, 2016, 6 pages.

(Continued)

*Primary Examiner* — Tarun Sinha
*Assistant Examiner* — Lal C Mang
(74) *Attorney, Agent, or Firm* — McCoy Russell LLP

(57) ABSTRACT

The present invention relates to an apparatus for calibrating a battery simulator having an input and an output, wherein a current path with an apparatus for measuring the current strength and with at least one capacitor is provided between the input and output. Furthermore, a voltage path can be provided between the input and output, with an apparatus for measuring the voltage and/or a current transformer, in the secondary current of which the apparatus for measuring the current strength is connected. If a battery simulator is connected to the apparatus it can charge the capacitor and then the capacitor can charge the battery simulator, whilst (Continued)

the current strength and voltage are measured, and on that basis the internal measurement devices of the battery simulator are calibrated.

16 Claims, 1 Drawing Sheet

(51) Int. Cl.
*G01R 31/3842* (2019.01)
*G01R 31/367* (2019.01)

(56) References Cited

U.S. PATENT DOCUMENTS

| | | | |
|---|---|---|---|
| 2006/0273800 A1* | 12/2006 | Horning | G01N 27/416 |
| | | | 324/426 |
| 2012/0176258 A1 | 7/2012 | Kuttner | |
| 2014/0077783 A1* | 3/2014 | Tanaka | H02M 3/07 |
| | | | 323/288 |
| 2014/0087227 A1* | 3/2014 | Shih | 429/99 |
| 2015/0268285 A1* | 9/2015 | Loftus | G01R 31/007 |
| 2015/0301120 A1 | 10/2015 | Tran et al. | |
| 2017/0331162 A1* | 11/2017 | Clarke | H01M 10/48 |
| 2017/0351225 A1* | 12/2017 | Hoenig | G05B 13/041 |

FOREIGN PATENT DOCUMENTS

| | | | |
|---|---|---|---|
| CN | 103345163 B | 1/2016 | |
| DE | 29621472 U1 | 3/1997 | |
| DE | 102010031884 A1 | 1/2012 | |
| DE | WO-2014095279 A1 * | 6/2014 | G01K 7/00 |
| DE | 102014207520 A1 | 10/2015 | |
| DE | 102014226190 A1 | 6/2016 | |
| KR | 20150139346 A | 12/2015 | |

OTHER PUBLICATIONS

ISA European Patent Office, International Search Report Issued in Application No. PCT/AT2018/060256, dated Mar. 6, 2019, WIPO, 3 pages.

* cited by examiner

APPARATUS AND METHOD FOR CALIBRATING A BATTERY SIMULATOR

CROSS-REFERENCE TO RELATED APPLICATIONS

The present application is a U.S. National Phase of International Patent Application Serial No. PCT/AT2018/060256 entitled "APPARATUS," filed on Oct. 24, 2018. International Patent Application Serial No. PCT/AT2018/060256 claims priority to Austrian Patent Application No. A 50895/2017 filed on Oct. 25, 2017. The entire contents of each of the above-referenced applications are hereby incorporated by reference for all purposes.

TECHNICAL FIELD

The invention relates to an apparatus for calibrating a battery simulator having a current path comprising at least one capacitor and an apparatus for measuring the current strength in the current path. The invention further relates to a method for calibrating a battery simulator in which at least one capacitor is charged by the battery simulator and discharged into it, wherein the current strength is measured.

BACKGROUND AND SUMMARY

Battery simulators are used in research and development of systems which contain batteries. Specifically in the automobile industry, electric drives are becoming increasingly important, in particular in electric and hybrid vehicles. The batteries used here are usually replaced by battery simulators which nowadays are usually a part of the test rig. A battery simulator is usually a dynamic DC current and DC voltage source which can also serve as a current sink. In this case, a battery is simulated by providing a voltage of up to several hundred volts in a constant or current-dependent manner, following a simulation model of a battery. In this case, the current in the positive counting direction, i.e. when the battery simulator delivers power, and also in the negative counting direction, i.e. when the battery simulator receives power, can be up to several hundred amperes. For regulating the battery simulator, voltage and current are measured using suitable internal measuring systems in the battery simulator wherein these measurement systems must be calibrated from time to time.

Battery simulators which are intended to simulate larger batteries such as, for example, a car battery are usually very large and heavy and as a result of this, fixed in position. Such a device can therefore not be sent to a calibrating institute or only at great expense which is why it is necessary or preferred to calibrate this in situ. Fundamentally numerous methods and devices are known in the prior art to calibrate the individual measuring devices of a battery simulator. In particular, the voltage measurement can be implemented simply using methods from the prior art. Furthermore, methods and devices for simulating batteries or battery management systems are known in which capacitors are used.

Known from DE 102014207520 A1 is an electronic circuit for a test rig for testing battery systems or battery management systems which comprises a simulation line having a capacitor which allows the simulation of a voltage profile when pre-charging an intermediate circuit when a charging DC voltage is applied. Parallel to the simulation line a further line is connected which allows the safe discharging of the capacitor after separating the charging DC voltage.

Further known from DE 102014226190 A1 is a test device for checking a battery control device or a battery with at least one cell. The test device in this case comprises a battery simulator for simulating a voltage of a cell of a simulated battery for specification to the battery control device, wherein the battery control device or the battery is connected to an evaluation module for processing and checking, inter alia, the voltage of the cell. The test device can furthermore control the compensating current which ensures that a uniform voltage exists between the cells of a battery composed of several cells. In a preferred embodiment, a capacitor is provided for intermediate storage of a voltage for the compensating current in the evaluation module.

However, no devices or methods are disclosed in the prior art which allow the calibration of the entire system of a battery simulator. In particular, the calibration of the negative currents, i.e. the generator mode of the calibrating device, i.e. that state in which the battery simulator to be calibrated functions as a heat sink, proves to be problematical. A suitable device must, on the one hand, also be capable of delivering suitably high currents. With the devices and methods known in the prior art, a further current source, e.g. a further battery simulator is required so that this provides the current which is fed into the battery simulator to be calibrated which functions as a current sink.

The aim of the present invention is accordingly to provide a device and a method for calibrating a battery simulator in which the requirement for an additional current source is avoided. In particular, a device should be created which is simple and mobile and which is suitable for automatic calibration of battery simulators.

According to the invention, this is achieved by a device of the type mentioned initially which has an input and an output for connection of a battery simulator, wherein a current path runs from the input to the output which has an apparatus for measuring the current strength and in which at least one capacitor is connected. The at least one capacitor can in this case in particular be designed as a capacitor battery. Thus, the calibrating device can receive very high currents when charging the at least one capacitor and can deliver very high currents during subsequent discharging of the at least one capacitor whilst the current strength is measured. As a result, a bidirectional calibration of the current is very efficient and precisely possible. Compared to batteries, capacitors have a higher power density with at the same time lower energy density, wherein the former is of greater importance when calibrating battery simulators.

The battery simulator which in particular can be calibrated using the invention described herein usually comprises a DC voltage source and sink as well as a DC current source and sink. In this way, both the generator mode, i.e. the power-delivering or battery-discharging mode and also the motor mode, i.e. the power-receiving or battery-charging mode, of a battery can be simulated.

Preferably the battery simulator is suitable for delivering voltages up to several hundred volts and also high currents in the positive and in the negative counting direction, i.e. in the generator and motor mode, up to several hundred amperes.

For regulating the battery simulator, preferably the voltage and the current strength are measured using suitable internal measuring systems in the battery simulator. This is also advantageous since the voltage delivered by the battery simulator should either be constant or current-dependent according to a simulation model of a battery.

It is further advantageous if the device for calibrating the battery simulator can not only measure the current strength but also the voltage since this is an important step for calibrating the entire system of the battery simulator with the aid of a single device. Such a possibility for measuring the voltage is furthermore favourable to calibrate the current-dependent provision of the voltage through the battery simulator. For this purpose, it is provided that parallel to the current path, a voltage path also exists on which a device for measuring the voltage on this path is provided. The voltage path therefore preferably runs from the input to the output of the device for calibrating the battery simulator. The voltage is preferably measured at several measurement points, which cover the entire voltage range.

The measurement of very high currents with a current measuring device is known to be problematical. In particular in (direct) measurement using a measuring resistance, the power loss would be very high. Thus, in a preferred embodiment of the device a current transformer with a primary and a secondary current is connected in the current path, wherein the secondary current runs to the apparatus for measuring the current strength and the primary current runs to the capacitor. Preferably a compensating current transformer is provided as current transformer. The secondary current in this case corresponds to a precisely specified fraction of the primary current, a thousandth or a five thousandth. The secondary current lies for example in the order of magnitude of several amperes. The secondary current can now be measured relatively simply using a current measuring device since the secondary current is galvanically separated from the primary current and is significantly smaller than this.

In a further embodiment of the last-mentioned preferred embodiment, the apparatus for measuring the current strength comprises a measuring resistance to which an apparatus for measuring the electrical voltage is connected in parallel to this. The current transformer and the measurement at the secondary current thereof ensure that the power loss at the measuring resistance is not too large.

Preferably an input contactor is connected after the input in the current path and/or an output contactor is connected before the output. Thus, the voltage on the current path can also be present when the current path is interrupted, i.e. when the contactors are open. In a preferred embodiment, the current path therefore runs from the input via the input contactor further via the current transformer and the capacitor via the output contactor to the output. Favourably the described invention should have respectively one input and respectively one output per measurement channel which are all connected to a contactor in the respective current path, wherein the respective current path runs parallel thereto from the respective input to the respective output.

In order to enable a fully automatic calibration, in a preferred embodiment the calibrating device can be connected to the outputs of the battery simulator to be calibrated. For this purpose, the device should have a communication interface. This can be designed, for example, as an RJ-45 socket on which the EtherCat protocol can be used.

In order to enable a fully automatic adjustment and calibration, in a further preferred embodiment of the last-mentioned preferred embodiment, it is provided that a control circuit exists between the battery simulator and the apparatus. In this case, the results of the internal measuring device of the battery simulator are compared with the corresponding measuring devices of the calibrating device and the measuring devices of the battery simulator are adjusted accordingly. The use of digital measuring devices in the calibrating device enables the automatic processing and storage of the measurement and calibrating data. Optionally the results of the calibration process are stored on a storage medium connected to the device or integrated in the device. Thus, in particular after a pre-heating time has elapsed, the calibrating process or adjustment and calibrating process can be started, wherein then the calibrating process or adjustment and calibrating process itself runs automatically.

In order that a longest possible measurement time can be achieved, in a preferred embodiment a capacitor or a capacitor battery having a total capacitance of more than 10 Farad, preferably of more than 100 Farad, in particular of more than 1000 Farad is used as the at least one capacitor which can also be implemented as a capacitor battery.

Preferably an electrochemical capacitor, which is known to have a high capacity per component or an interconnection of such is used for the at least one capacitor. Thus, in turn a longest possible measurement time is achieved.

Preferably the electrochemical capacitor is configured as a supercapacitor, super cap or ultra-capacitor. It is known that super-capacitors typically have 10000 times higher capacitance values per component than, for example, electrolytic capacitors, with the result that again a longest possible measurement time is achieved.

The invention further relates to a method for calibrating a battery simulator having an input and an output, wherein a current path on which the current strength is measured, is provided between input and output. A capacitor is connected in the current path. In the method according to the invention, this is at least partially charged by the battery simulator and then at least partially discharged in the battery simulator. Use is therefore made of the fact that a battery simulator comprises both a DC current source and also a DC current sink. Thus, no additional DC current source is required to test the motor, i.e. power-receiving mode of the battery simulator.

Preferably an input contactor is connected in the current path after the input and an output contactor is connected before the output. Then, in a voltage path running parallel to the current path, a voltage measurement can be carried out when the current path is interrupted. That is, the voltage is measured at no-load, advantageously at several measurement points.

It is desirable that the calibrating process or adjustment and calibrating process can take place automatically. For this purpose, it is preferably provided that with the aid of a communication interface a control circuit to the battery simulator exists. Then the voltages and current strengths measured by the battery simulator are compared with those measured in the voltage and in the current path the measuring devices of the battery simulator are adjusted in such a manner that there are no longer any deviations between the quantities measured by the battery simulator and the quantities measured in the current and voltage path.

BRIEF DESCRIPTION OF THE FIGURES

The invention described herein is particularly suitable for use in the automobile industry, especially for a battery simulator integrated in a test rig but should not remain restricted to such an area of use. The invention is further suitable in particular for implementation in a mobile device, wherein a stable transport case can be used as the housing of the device.

The invention is explained in further detail hereinafter with reference to preferred exemplary embodiments shown in the drawings, to which however they should not be restricted. In detail in the drawings.

DETAILED DESCRIPTION

Figure 1:
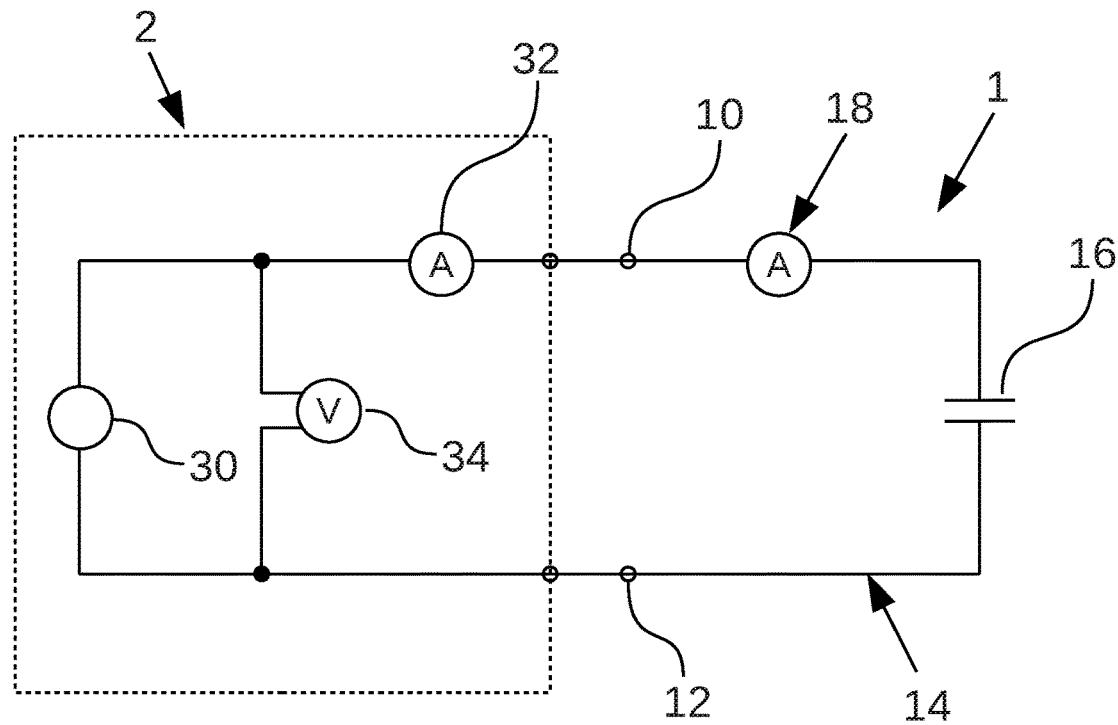
FIG. 1 shows a circuit of one embodiment of an apparatus according to the invention for calibrating a battery simulator with a current path and a battery simulator connected to this.

FIG. 1 shows an embodiment of the apparatus 1 for calibrating a battery simulator and an embodiment of a battery simulator 2. The apparatus has an input 10 and an output 12. Between these runs a current path 14 in which a capacitor 16 and an apparatus 18 for measuring the current strength are connected. The apparatus 1 for calibrating a battery simulator is connected to a battery simulator 2. This comprises a DC voltage source and sink and/or DC current source and sink 30, a current measuring device 32 connected in series and a voltage measuring device 34 connected in parallel.

In the embodiment shown, the DC voltage source and sink and/or DC current source and sink 30 of the battery simulator 2 initially provides a DC voltage which can, for example, be constant or current-dependent, following a simulation model of an arbitrary battery and which can be adjusted with the aid of the internal current measuring device 32 and voltage measuring device 34 of the battery simulator 2. In consequence, the capacitor 16 of the apparatus 1 for calibrating a battery simulator is charged and energy is stored therein; this corresponds to a motor operating mode of the apparatus 1 for calibrating a battery simulator. The capacitor 16 is then discharged in the battery simulator 2; this corresponds to the generator operating mode of the apparatus 1 for calibrating a battery simulator. During the motor and/or generator operating mode, the current strength in the current path 14 is measured by the apparatus 18 for measuring the current strength. The current measuring device 32 of the battery simulator 2 can be calibrated by means of the measurement results of the apparatus 18 for measuring the current strength.

Figure 2:
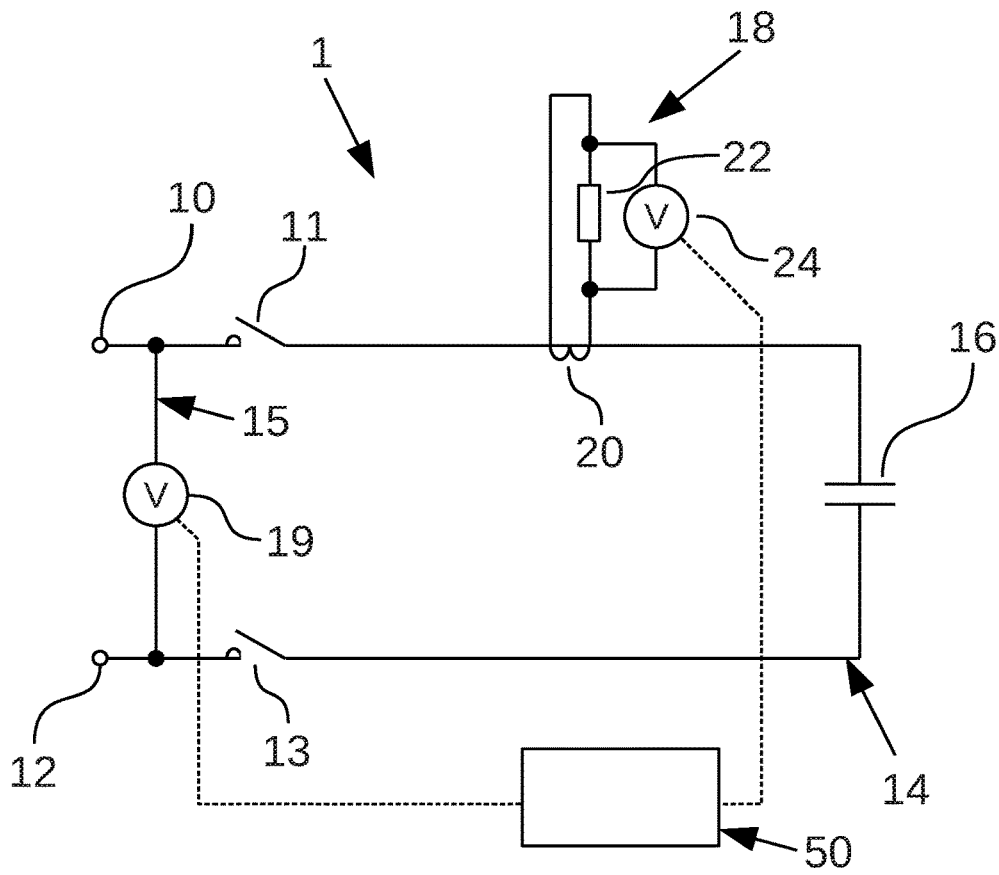
FIG. 2 shows a preferred embodiment of the apparatus according to the invention for calibrating a battery simulator with a current and a voltage path.

FIG. 2 shows a further preferred embodiment of the apparatus 1 for calibrating a battery simulator. A current path 14 and a voltage path 15 are connected in parallel to the input 10 and the output 12. An apparatus 19 for measuring the electric voltage is connected in the voltage path 15. The current path runs via an input contactor 11 to a current transformer 20, the secondary current of which runs via an apparatus 18 for measuring the current strength. The primary current of the current transformer 20 runs further via the capacitor 16 to the output contactor 13. The apparatus 18 for measuring the current strength consists of a measuring resistance 22 to which a further apparatus 24 for measuring the electric voltage is connected in parallel.

It is provided that a battery simulator is connected to the input 10 and the output 12. Then current strength and voltage can be measured whilst the apparatus is operated as already explained in the motor and in the generator operating mode. For the current strength measurement the current transformer 20 delivers a smaller secondary current proportional to the primary current to the apparatus 18 for measuring the current strength. This apparatus 18 for measuring the current strength is here configured as a parallel circuit of a measuring resistance 22 and an apparatus 24 for measuring the electric voltage. Furthermore, even when the contactors 11, 13 are open, a voltage measurement can be made at no-load. The internal measuring devices of a connected battery simulator can be calibrated by means of the measurement results of the apparatus 18 for measuring the current strength and the apparatus 19 for measuring the voltage.

FIG. 2 further shows a communication interface 50 whose exemplary connections to the apparatus 19 for measuring the voltage and the apparatus 24 for measuring the voltage, which is part of the apparatus 18 for measuring the current strength, are indicated by dashed lines. In a preferred embodiment it is provided that this communication interface 50 serves to produce a control circuit between the apparatus 1 for calibrating a battery simulator and the battery simulator to be calibrated and that the quantities measured by the battery simulator are compared with the quantities measured in the voltage path 15 and in the current path 14 and in the event of deviations between the quantities measured by the battery simulator and the quantities measured in the voltage path 15 and in the current path 14, the measuring devices of the battery simulator are adjusted according to the quantities measured in the voltage path 15 and in the current path 14. In particular, the adjustment and calibration of the battery simulator can thus be carried out automatically.

The exemplary embodiments shown in the figures and explained in connection with these are used to explain the invention and are not restrictive for this.

The invention claimed is:

1. A system comprising
   a. a battery simulator having a DC voltage source and sink and/or a DC current and sink and
   b. an apparatus which is adapted to calibrate the battery simulator and which has an input and an output, for connection of the battery simulator, wherein between input and output a current path with a current strength measuring device for measuring the current strength in the current path is provided wherein at least one capacitor is connected in the current path of the apparatus.

2. The system according to claim 1, wherein the battery simulator is suitable for receiving or delivering voltages above 100 Volts and/or currents above 100 Amperes.

3. The system according to claim 1, wherein the battery simulator has a current measuring device and/or a voltage measuring device.

4. The system according to claim 1, wherein the apparatus is operable in a motor operating mode and in a generator operating mode, wherein in the motor operating mode the at least one capacitor is charged by the battery simulator and in the generator operating mode the capacitor is discharged in the battery simulator, wherein the current strength is measured.

5. The system according to claim 1, wherein an apparatus for measuring the electric voltage is provided in a voltage path between input and output.

6. The system according to claim 1, wherein a current transformer with a primary and a secondary current is disposed in the current path, wherein the secondary current runs to the current strength measuring apparatus for measuring the current strength and the primary current runs to the capacitor.

7. The system according to claim 6, wherein the current strength measuring apparatus for measuring the electrical current strength comprises a measuring resistance to which an apparatus for measuring the electrical voltage is connected in parallel to this.

8. The system according to claim 1, wherein an input contactor is connected in series after the input in the current path and/or an output contactor is connected in series before the output.

9. The system according to claim 1, wherein a communication interface for communication with the battery simulator is provided.

10. The system according to claim 9, wherein a control circuit can be established between the battery simulator and the apparatus with the communication interface, wherein the quantities measured by the apparatus and the quantities measured by the battery simulator are compared continuously and in the event of a deviation of the quantities measured by the battery simulator and by the apparatus, the measuring apparatuses of the battery simulator are adjusted according to the quantities measured by the apparatus.

11. The system according to claim 1, wherein the at least one capacitor has a total capacitance of more than 10 Farad, in particular of more than 100 Farad, preferably of more than 1000 Farad.

12. The system according to claim 1, wherein the capacitor comprises at least one electrochemical capacitor.

13. The system according to claim 12, wherein the electrochemical capacitor comprises at least one supercapacitor.

14. A method for calibrating a battery simulator with an apparatus having an input and an output for connection of the battery simulator, wherein a current path whose current strength is measured, is provided between the input and the output, wherein a capacitor in the current path is at least partially charged by the battery simulator and then the capacitor at least partially charges the battery simulator.

15. The method according to claim 14, wherein the current path after the input is interrupted with an input contactor and/or before the output is interrupted with an output contactor, when a measurement of the voltage is carried out on a voltage path between the input and the output.

16. The calibrating method according to claim 15, wherein with the aid of a communication interface a control circuit to the battery simulator exists and that the quantities measured by the battery simulator are compared with the quantities measured in the voltage path and in the current path and in the event of deviations between the quantities measured by the battery simulator and the quantities measured in the voltage path and in the current path, measuring devices of the battery simulator are adjusted according to the quantities measured in the voltage path and in the current path.

\* \* \* \* \*